United States Patent
Fujikawa

(10) Patent No.: US 10,995,418 B2
(45) Date of Patent: May 4, 2021

(54) SHIELDING MEMBER AND SINGLE CRYSTAL GROWTH DEVICE HAVING THE SAME

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 16 days.

(21) Appl. No.: 16/406,539

(22) Filed: May 8, 2019

(65) Prior Publication Data

US 2019/0345631 A1 Nov. 14, 2019

(30) Foreign Application Priority Data

May 11, 2018 (JP) .............................. JP2018-092042

(51) Int. Cl.
*C30B 23/02* (2006.01)
*C30B 23/06* (2006.01)
*C30B 23/00* (2006.01)
*C30B 35/00* (2006.01)
*C30B 29/36* (2006.01)

(52) U.S. Cl.
CPC .......... *C30B 23/066* (2013.01); *C30B 23/002* (2013.01); *C30B 29/36* (2013.01); *C30B 35/007* (2013.01)

(58) Field of Classification Search
CPC .......... C30B 35/00; C30B 23/00; C30B 23/02
See application file for complete search history.

(56) References Cited

U.S. PATENT DOCUMENTS

| 2,854,364 A * | 9/1958 | Lely .......................... C30B 23/00 117/84 |
| 6,336,971 B1 * | 1/2002 | Nagato .................... C30B 29/36 117/109 |

FOREIGN PATENT DOCUMENTS

| CN | 110424051 A | 11/2019 |
| EP | 1 164 211 A1 | 12/2001 |
| JP | 08-295595 A | 11/1996 |
| JP | 2000044383 A | 2/2000 |
| JP | 2000-264795 A | 9/2000 |
| JP | 4199921 B2 | 12/2008 |

(Continued)

OTHER PUBLICATIONS

Communication dated Nov. 5, 2020, from the State Intellectual Property Office of the P.R.C. in application No. 201910369851.6.

*Primary Examiner* — Robert M Kunemund
(74) *Attorney, Agent, or Firm* — Sughrue Mion, PLLC

(57) ABSTRACT

A shielding member, wherein the shielding member is formed of at least one of structure which has a non-flat plate shape having an inclined surface, and the inclined surface is located on a side of a substrate support part when the shielding member is disposed in a single crystal growth device, wherein the single crystal growth device comprising: a crystal growth container; a source storage part that is positioned at a lower inner part of the crystal growth container; the substrate support part, wherein the support part is disposed above the source storage part and supports a substrate to make the substrate face the source storage part; and a heating device that is disposed on an outer circumference of the crystal growth container, wherein the shielding member is disposed between the source storage part and the substrate support part, and wherein a single crystal of a source is grown on the substrate by sublimating the source from the source storage part.

19 Claims, 8 Drawing Sheets

(56) References Cited

FOREIGN PATENT DOCUMENTS

| JP | 2009091172 A | 4/2009 |
|---|---|---|
| JP | 2010-013296 A | 1/2010 |
| WO | 00/39372 A1 | 7/2000 |

* cited by examiner (a)
(b)

(a)
(b)

SHIELDING MEMBER AND SINGLE CRYSTAL GROWTH DEVICE HAVING THE SAME

BACKGROUND OF THE INVENTION

Field of the Invention

The present invention relates to a shielding member and a single crystal growth device having the same.

Priority is claimed on Japanese Patent Application No. 2018-092042, filed May 11, 2018, the content of which is incorporated herein by reference.

Description of Related Art

Silicon carbide has excellent characteristics such as high thermal and dielectric breakdown voltages, a wide energy band gap, and high thermal conductivity. Therefore, silicon carbide can be applied to high power devices, high temperature resistant semiconductor elements, radiation resistant semiconductor elements, high-frequency semiconductor elements, and the like. Since performance improvement of silicon is approaching limits due to property limits of the material itself, silicon carbide which has higher property limits than silicon has been focused on. In recent years, as an energy saving technology for reducing energy loss during power conversion which is a countermeasure against global warming problems, anticipation is growing for a power electronics technology using a silicon carbide material.

As the core technology for this, research and development of a silicon carbide single crystal growth technology have been actively conducted.

In order to reduce production costs for promoting practical use, a fast single crystal growth reaction is urgently required.

A silicon carbide single crystal has polymorphs such as 3C—SiC, 4H—SiC, and 6H—SiC (crystalline polymorph), that is, it has various crystal structures. The polymorphs are provided such that, even if silicon carbide has different crystal structures, there is no difference in the structures of the outermost surface when viewed in a c axis direction (<000-1> direction).

Among these polymorphs, in particular, a 4H—SiC single crystal has high mobility. Therefore, use of the 4H—SiC single crystal for a power device and the like is expected.

As a silicon carbide single crystal growth method, a method in which a silicon carbide single crystal is grown on a silicon carbide seed crystal using a reaction between silicon vapor and carbon is known. For example, in the method disclosed in Patent Document 1, an evaporated gas from a silicon source rises. Next, a carbon material to be described below is heated to a temperature, which is higher than that of a silicon source and is higher than that of a silicon carbide seed crystal substrate, of 1600° C. or higher. Next, the gas is passed through a porous carbon material or a through-hole-perforated carbon material, wherein the material is disposed above the silicon source. In addition, a gas reacted with the carbon material rises and reaches the seed crystal substrate disposed above the carbon material. According to the above method, a silicon carbide single crystal grows on the seed crystal substrate.

In the method in Patent Document 1, a carbon material having pores is disposed between the source and the seed crystal substrate, and this carbon material is used for carbon source supply to generate a silicon carbide single crystal.

In addition, a sublimation recrystallization method is known as another growth method. In this method, a source silicon carbide is sublimated in a crystal growth container, silicon carbide is recrystallized on a low temperature seed crystal substrate, and a silicon carbide single crystal is grown (see, for example, Patent Documents 2 and 3).

FIG. 13 shows an example of a single crystal growth device having a crystal growth container for producing a conventional silicon carbide single crystal.

As shown in FIG. 13A, a single crystal growth device 100 used for producing a silicon carbide single crystal according to a sublimation recrystallization method includes a source storage part 102 positioned in a lower part of a crystal growth container 101, a substrate support part 104 that is disposed above the source storage part 102 and supports a seed crystal 103 on a circular substrate support surface, and a heating unit 105 that is disposed on the outer circumference of the crystal growth container 101. In addition, it is known that, in order to make a difference in temperature between the seed crystal 103 and the source storage part 102, a shielding plate (shielding member) 106 formed of a circular flat plate is disposed between the seed crystal 103 and the source storage part 102 (for example, Patent Document 4).

In the single crystal growth device 100, the shielding plate 106 prevents the seed crystal 103 from directly receiving radiant heat from a source part 107, and thus a temperature rise in the seed crystal is reduced.

PATENT DOCUMENT

Patent Document 1: Japanese Patent No. 4199921
Patent Document 2: PCT International Publication No. WO 2000/39372
Patent Document 3: Japanese Unexamined Patent Application, First Publication No. 2010-13296
Patent Document 4: Japanese Unexamined Patent Application, First Publication No. H8-295595
Patent Document 5: Japanese Unexamined Patent Application, First Publication No. 2000-264795

SUMMARY OF THE INVENTION

Incidentally, in order to reduce production costs, it is desirable to increase a single crystal growth rate. It is known that, when a temperature of a region in the vicinity of a seed crystal is lowered, a growth rate can be faster. However, when the temperature of the seed crystal is lowered, the temperature of the shielding plate is lowered. In a conventional shielding plate, when the temperature in the vicinity of the seed crystal is excessively lowered, the temperature of the upper surface of the shielding plate is lowered and oversaturation is likely to occur. As a result, a problem is caused wherein polycrystalline deposits being adhered to the upper surface of the shielding plate. In this case, an amount of gas contributing to growth is reduced. In addition, it becomes difficult to control the composition (C/Si ratio) of a sublimation gas, and therefore carbon inclusions, Si droplets, and the like are mixed in a crystal, and the quality deteriorates.

The present invention has been made in view of the above problems, and an object of the present invention is to provide a shielding member having an upper surface to which deposits are unlikely to adhere and a single crystal growth device having the same.

In order to solve the above problems, the present invention provides the following aspects.

(1) A shielding member according to an aspect of the present invention is a shielding member, wherein the shielding member is formed of at least one structure which has a non-flat plate shape having an inclined surface, and the inclined surface is located on a side of a substrate support part when the shielding member is disposed in a single crystal growth device, wherein the single crystal growth device comprising: a crystal growth container; a source storage part that is positioned at a lower inner part of the crystal growth container; the substrate support part, wherein the support part is disposed above the source storage part and supports a substrate to make the substrate face the source storage part; and a heating device that is disposed on an outer circumference of the crystal growth container, wherein the shielding member is disposed between the source storage part and the substrate support part, and wherein a single crystal of a source is grown on the substrate by sublimating the source from the source storage part.

The shielding member according to the first aspect preferably has the following features. One or more of the following features are preferably combined.

(2) In the shielding member according to (1), the non-flat plate shape may be one shape selected from the group consisting of an approximately cone shape, an approximately truncated cone shape, an approximately pyramid shape, an approximately truncated pyramid shape, and a torus shape.
(3) A top part of the shielding member according to (1) may be formed as a curved surface.
(4) The shielding member according to (1) to (3) may have a plurality of structures.
(5) In the shielding member according to (1) to (4), the inclined surface may be coated with a metal carbide or a liner member made of a metal carbide may be attached to the inclined surface.
(6) In the shielding member according to (5), the metal carbide may be TaC.
(7) In the shielding member according to the above aspect, a surface roughness $R_a$ of the inclined surface may be less than 8 μm.
(8) A single crystal growth device according to another aspect of the present invention is a device having the shielding member according to any one of (1) to (7).

The device preferably has two or more features selected from (1) to (7).

According to the shielding member of the present invention, even if a temperature in the vicinity of a seed crystal is lowered in order to increase a single crystal growth rate, it is possible to prevent a deposit from adhering to a shielding member. Therefore, it is possible to prevent production costs from increasing and single crystal quality from deteriorating.

According to the single crystal growth device of the present invention, even if a temperature in the vicinity of a seed crystal is lowered in order to increase a single crystal growth rate, it is possible to prevent a deposit from adhering to a shielding member. Therefore, it is possible to prevent production costs from increasing and single crystal quality from deteriorating.

DETAILED DESCRIPTION OF THE INVENTION

Figure 1:
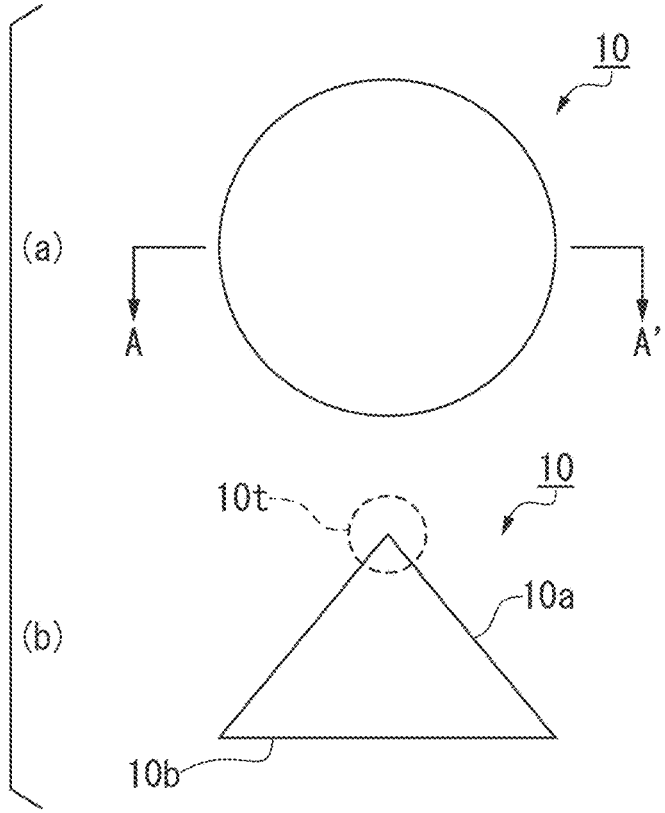
FIG. 1 shows diagrams of a preferable example of a shielding member of the present invention, (a) is a schematic plan view showing an example of a conical shielding member of a first embodiment, and (b) is a schematic cross-sectional view taken along the line A-A'.

Shielding members according to preferable examples of the present embodiment and single crystal growth devices having the same will be appropriately described below in detail with reference to drawings.

Here, in the drawings used in the following description, in order to facilitate understanding of features of the present invention, feature parts are enlarged for convenience of illustration in some cases, and size, ratios and the like of components may be different from actual components. In addition, materials, sizes, and the like exemplified in the following description are examples, the present invention is not limited thereto, and they can be appropriately changed and implemented without departing from the spirit and scope of the invention. Unless otherwise specified, numbers, sizes, positions, materials, ratios, shapes, and the like may be changed, added, or omitted as necessary.

First Embodiment

A preferable example of a shielding member according to a first embodiment will be described with reference to FIGS. 1 to 5.

In FIG. 1, (a) is a schematic plan view of a shielding member of the first embodiment of the present invention, and (b) is a schematic cross-sectional view taken along the line A-A'. In (b) shown in FIG. 1, when a shielding member is provided in a crystal growth container, a direction toward a substrate support part is indicated as upward, and a direction toward a source storage part of the crystal growth container is indicated as downward. That is, a side of the shielding member which faces a substrate support part is shown as upper side, and the other side of the shielding member which faces a source storage part of the crystal growth container is shown as lower side.

A shielding member 10 shown in FIG. 1 has a non-flat plate structure and has an inclined surface 10a on the surface on a substrate support part side (upper side) when the shielding member is disposed, and more specifically, has a conical structure. The shielding member has a shape that becomes gradually thicker from a part (a top part 10t) of the shielding member closest to the substrate support part toward a part (a bottom part 10b) closest to the source storage part.

"Inclined surface" in this specification refers to a surface that is inclined with respect to a horizontal surface orthogonal to a vertical axis direction (a vertical direction; a direction in which a substrate support part and a source storage part are connected) of a crystal growth container when placed in the crystal growth container.

The shielding member has an inclined surface on the surface on a substrate support part side (upper side). Accordingly, compared to a conventional flat shielding plate, it is possible to improve the fluidity of a source gas according to a wall surface of the shielding member closer to being parallel to a source gas flow, and crystal nuclei adhered to the upper surface of the shielding member fall due to gravity, and therefore it is possible to prevent growing of the crystal nuclei. As a result, in the shielding member of the present invention, it is possible to prevent deposits from being adhered to the shielding plate without changing a temperature environment in the container.

In the cross-sectional view (b) shown in FIG. 1, the inclined surface 10a is shown as a straight line segment, indicating that the inclined surface is a flat surface without irregularities. However, the shape of the inclined surface is not limited to a flat surface, and the inclined surface may be a curved surface represented by a curve in a cross-sectional view.

"A structure which has a non-flat plate shape having an inclined surface, and the inclined surface is located on a side of the substrate support part when the shielding member is disposed" explicitly indicates that the upper surface has an inclined surface, and the structure has a shape different from the shape of a conventional flat shielding plate having an upper surface and a lower surface (bottom surface) which are parallel to each other.

"Non-flat plate shape" refers to a shape other than a flat plate shape, and examples thereof include a cone shape, an approximately cone shape, a truncated cone shape, an approximately truncated cone shape, a pyramid shape, an approximately pyramid shape, a truncated pyramid shape, an approximately truncated pyramid shape, a torus shape, an approximately torus shape, and combinations thereof. In the non-flat plate like structure, a plate-like structure may be connected to a bottom surface having no inclination of the structure. The term "approximately" means, for a cone shape and the like, not only a shape having a vertex but also a shape having no vertices where a top part thereof is a curved surface.

The "structure which has a non-flat plate shape" is preferably symmetrical to a vertical line passing through the center of a seed crystal when disposed in the crystal growth container. This is to make the temperature environment in the crystal growth container symmetrical.

Since the shielding member of the present invention has an inclined surface on the surface of the substrate support part side (a surface when viewed from the substrate support part side), compared to a conventional flat shielding plate (a structure in which an upper surface and a lower surface (bottom surface) are parallel to each other), due to a proportion of the inclined surface within surfaces on the substrate support part side, deposits are unlikely to adhere to the shielding member of the present invention. When the shielding member of the present invention has, for example, a cone shape or a pyramid shape, as a three-dimensional type, surfaces other than the bottom surface are inclined surfaces. However, the shielding member is not limited to such a structure in which surfaces other than the bottom surface are inclined surfaces, but when a proportion of the inclined surfaces among surfaces other than the bottom surface increases, deposits are unlikely to adhere.

In the shielding member of the present invention, a proportion of the inclined surfaces among surfaces other than the bottom surface is not limited and can be arbitrarily selected. As a guideline, 50% or more is preferable, 60% or more is more preferable, and 70% or more is most preferable. In the case of a conical shielding member or a pyramidal shielding member, surfaces other the bottom surface are all inclined surfaces, and a proportion of the inclined surfaces in surfaces other than the bottom surface is 100%.

Regarding an inclination of the inclined surface, an angle of less than 90° can be arbitrarily selected. In addition, 5° or more is preferable. This enables adhesion of the deposit on the shielding member to be further reduced. In addition, 20° to 75° is more preferable.

Here, the inclination in this specification refers to an angle formed by the bottom surface and the inclined surface in a vertical cross section of the shielding member. When the inclined surface or the bottom surface is a curved surface, an inclination can be calculated using respective tangents.

Figure 2:
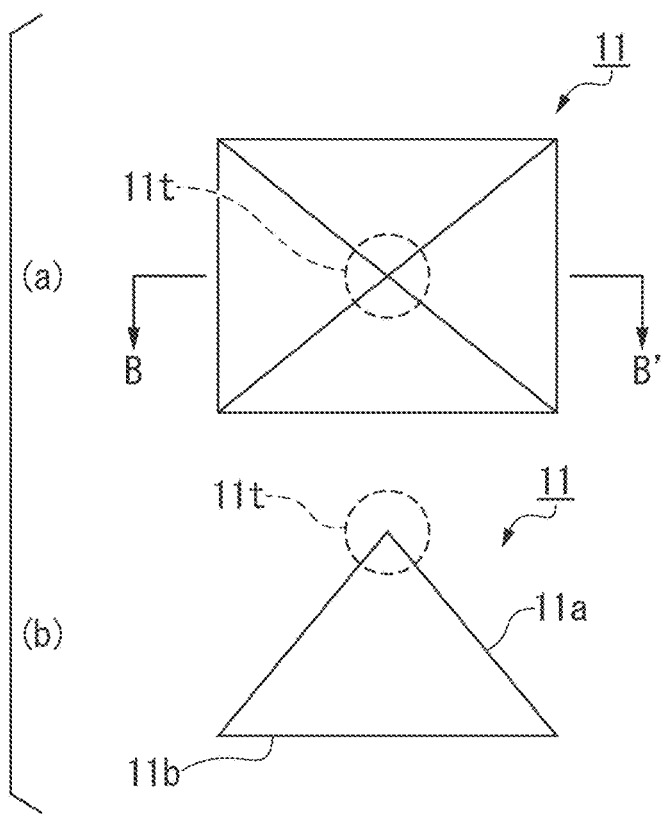
FIG. 2 shows diagrams of a preferable example of a shielding member of the present invention, (a) is a schematic plan view showing an example of a shielding member 11 when the shape is a pyramid shape, and (b) is a schematic cross-sectional view taken along the line B-B'.

The shape of the shielding member can be, for example, a conical shape (FIG. 1) or a pyramid shape (FIG. 2). When the shape of the shielding member is a pyramid shape, the shape of the bottom part can be an arbitrarily selected polygon, for example, a triangle or a rectangle.

In FIG. 2, (a) shows a schematic plan view of a shielding member 11 in which the shape of the shielding member is a pyramid shape, and (b) is a schematic cross-sectional view thereof taken along the line B-B'. As in FIG. 1, in (b) of FIG. 2, when the shielding member is provided in a single crystal growth device, a direction toward a substrate support part side is indicated as upward, that is, indicated as an upper side, and a direction toward a source storage part of the single crystal growth device is indicated as downward, that is, indicated as a lower side.

The shielding member 11 shown in FIG. 2 has a non-flat plate like structure having an inclined surface 11a on the surface on a substrate support part side, that is, on a upper side, when disposed in the device, and more specifically, the shielding member 11 is a square pyramidal structure. The shielding member has a shape of which a horizontal cross-sectional area gradually becomes larger from a part (a top part 11t) of the shielding member closest to the substrate support part toward a part (a bottom part 11b) closest to the source storage part.

Figure 3:
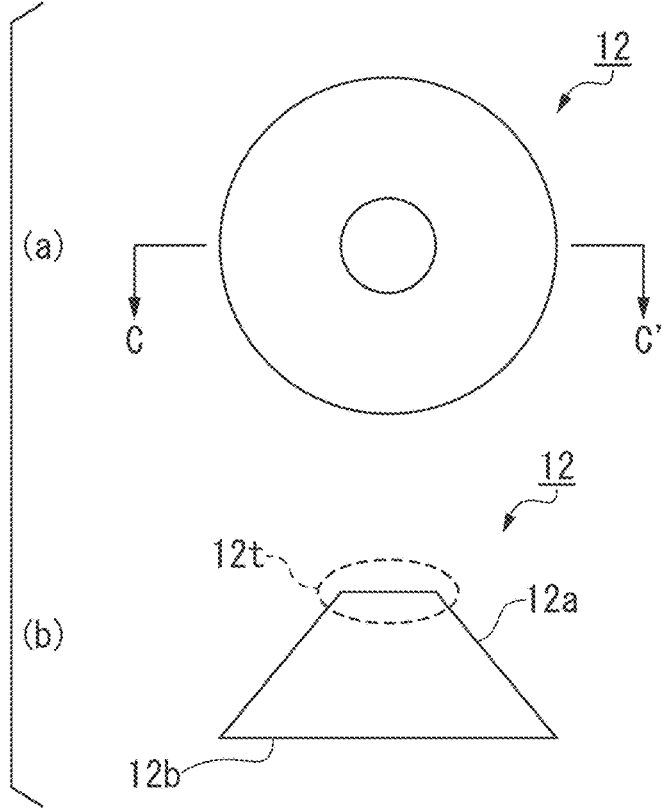
FIG. 3 shows diagrams of a preferable example of a shielding member of the present invention, (a) is a schematic plan view showing an example of a shielding member 12 when the shape is a truncated conical shape, and (b) is a schematic cross-sectional view taken along the line C-C'.
Figure 4:
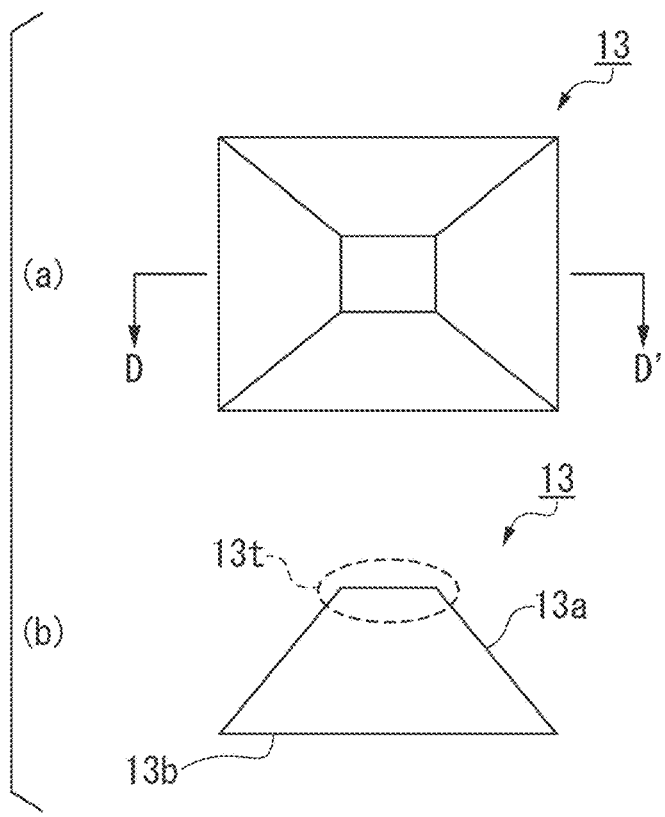
FIG. 4 shows diagrams of a preferable example of a shielding member of the present invention, (a) is a schematic plan view showing an example of a shielding member 13 when the shape is a truncated pyramid shape, and (b) is a schematic cross-sectional view taken along the line D-D'.

The shape of the shielding member can be, for example, a truncated conical shape (FIG. 3) or a truncated pyramid shape (FIG. 4). When the shape of the shielding member is a truncated pyramid, the shape of the bottom part can be an arbitrarily selected polygon, for example, a triangle or a rectangle. The truncated conical shape and the truncated pyramid shape can be viewed as a shape in which the top part of the above conical shape and pyramid shape is partially truncated.

In FIG. 3, (a) is a schematic plan view of a shielding member 12 in which the shape of the shielding member is a truncated conical shape, and (b) is a schematic cross-sectional view thereof taken along the line C-C'. As in FIG. 1, in (b) of FIG. 3, when the shielding member is provided in a single crystal growth device, a direction toward a substrate support part side is indicated as upward (upper side), and a direction toward a source storage part of the single crystal growth device is indicated as downward (lower side).

In FIG. 4, (a) is a schematic plan view of a shielding member 13 in which the shape of the shielding member is a truncated pyramid shape, and (b) is a schematic cross-sectional view thereof taken along the line D-D'. As in FIG. 1, in (b) of FIG. 4, when the shielding member is provided in a single crystal growth device, a direction toward a substrate support part side is indicated as upward (upper side), and a direction toward a source storage part of the single crystal growth device is indicated as downward (lower side).

In the truncated conical and truncated pyramidal shielding members, deposits are likely to be adhered to the upper surface parallel to the bottom surface, compared to the above conical and pyramidal shielding members. However, since it has an inclined surface, the amount of deposits adhered is reduced compared to a conventional flat plate like shielding plate.

Figure 13:
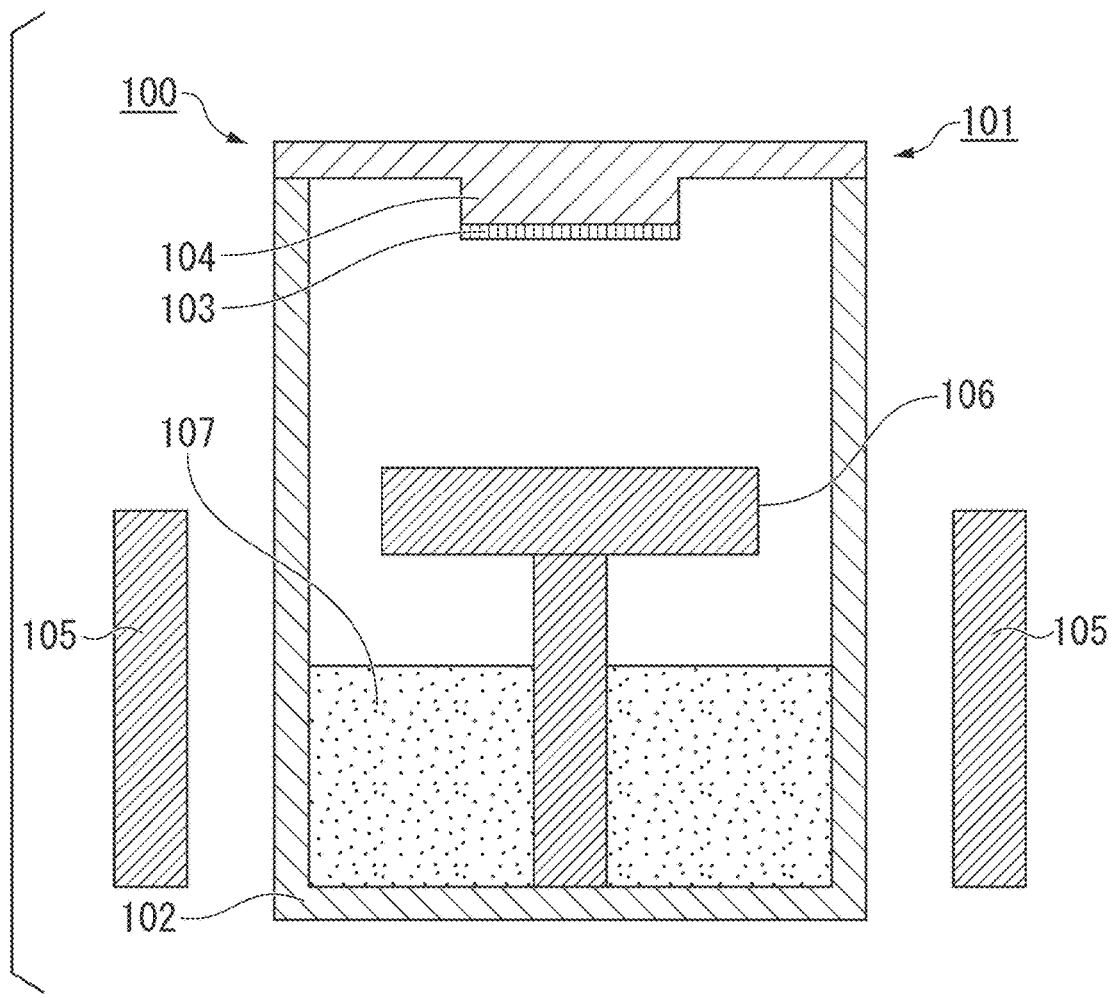
FIG. 13 is a schematic cross-sectional view showing a conventional single crystal growth device.

A part of the shielding member closest to the substrate support part can be formed as a curved surface. For example, a conical shape, a pyramid shape, a truncated pyramid shape or a truncated conical shape in which the top part (10t in FIG. 1, 11t in FIG. 2, 12t in FIG. 3, and 13t in FIG. 4) is formed as a curved surface can be the shape of the shielding member.

Figure 5:
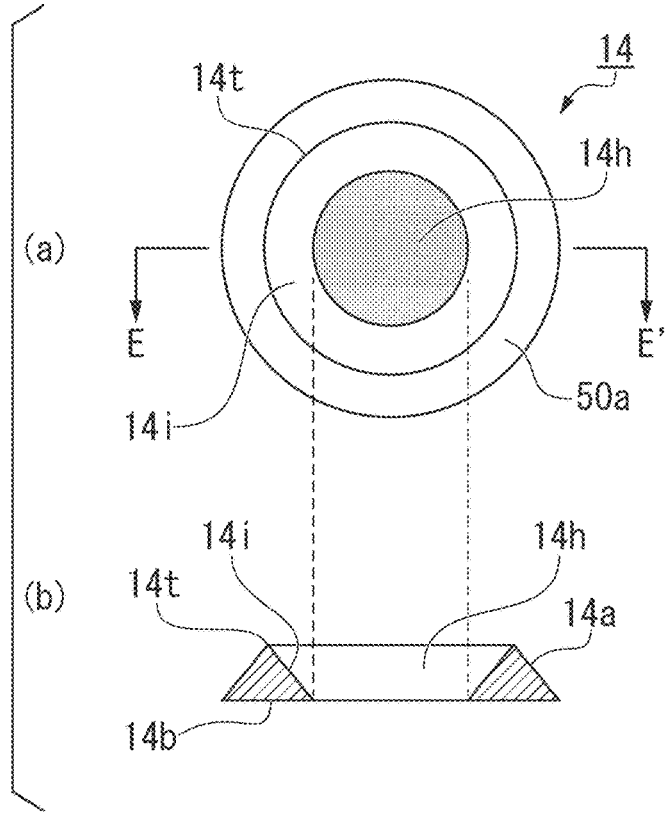
FIG. 5 shows diagrams of a preferable example of a shielding member of the present invention, (a) is a schematic plan view showing an example of a shielding member 14 when the shape is a torus shape, and (b) is a schematic cross-sectional view taken along the line E-E'.

In addition, the shape of the shielding member may be, for example, a torus shape (FIG. 5).

In FIG. 5, (a) is a schematic plan view of a shielding member 14 when the shape of the shielding member is a torus shape in a plan view and (b) is a schematic cross-sectional view thereof taken along the line E-E'. In (b) of FIG. 5, when the shielding member is provided in a single crystal growth device, a direction toward a substrate support part side is indicated as upward (upper side), and a direction toward a source storage part of the single crystal growth device is indicated as downward (lower side).

The shielding member 14 shown in FIG. 5 has a hollow part 14h like a so-called donut, and has a solid annular shape in a plan view, and has a configuration with inclined surfaces 14a and 14i on the substrate support part side. As shown in (a) of FIG. 5, a bottom part 14b on the side of the source storage part may be a flat bottom. The vertical cross section of an annular ring is a triangle as shown in (b) of FIG. 5, the side of the hollow part 14h is referred to as the inner inclined surface 14i, and the inclined surface facing the outside of the annular shape is referred to as the outer inclined surface 14a. In addition, a line connecting vertices of a triangle is called a ridge (top part) 14t.

In (b) of FIG. 5, the inner inclined surface 14i and the outer inclined surface 14a are indicated as line segments, which show that the inclined surface is flat. However, the shape of the inner inclined surface is not limited to a flat surface, but may be a curved surface.

In addition, a part of the shielding member closest to the substrate support part can be formed of a curved surface. For example, a torus shape in which the ridge 14t is formed of a curved surface can be a shape of the shielding member.

Accordingly, it is possible to further reduce disturbance of a flow of a gas containing a source. It is possible to prevent the deposit from being generated on the surface on the hollow part side of the shielding member.

Second Embodiment

A shielding member according to a second embodiment will be described.

The shielding member according to the second embodiment has a configuration in which a plurality of non-flat plate like structures shown in FIG. 1 to FIG. 5 are selected and combined as necessary. For example, a plurality of non-flat plate like structures shown in FIG. 1 to FIG. 5 can be arranged in parallel to form a shielding member. Such a shielding member may include a table in which a plurality of structures are provided (for example, refer to the reference numeral 15C in FIG. 6). A preferable example of the first embodiment can be preferably used in the second embodiment as well. The number of structures may be arbitrarily selected.

For example, when a conical shielding member as shown in FIG. 1 is used, if the diameter of the shielding member increases without changing an inclination while increasing the diameter, the cone height increases. As a result, when the container (crucible) is enlarged in the longitudinal direction, a distance between the seed crystal and the source (source material) increases and arrival of a source gas is restricted, that is, an arrival delay is caused, and thus there is concern of a desired growth rate not being obtained. It is possible to solve such a problem using a configuration in which a plurality of non-flat plate like structures shown in FIG. 1 to FIG. 5 are combined.

Figure 6:
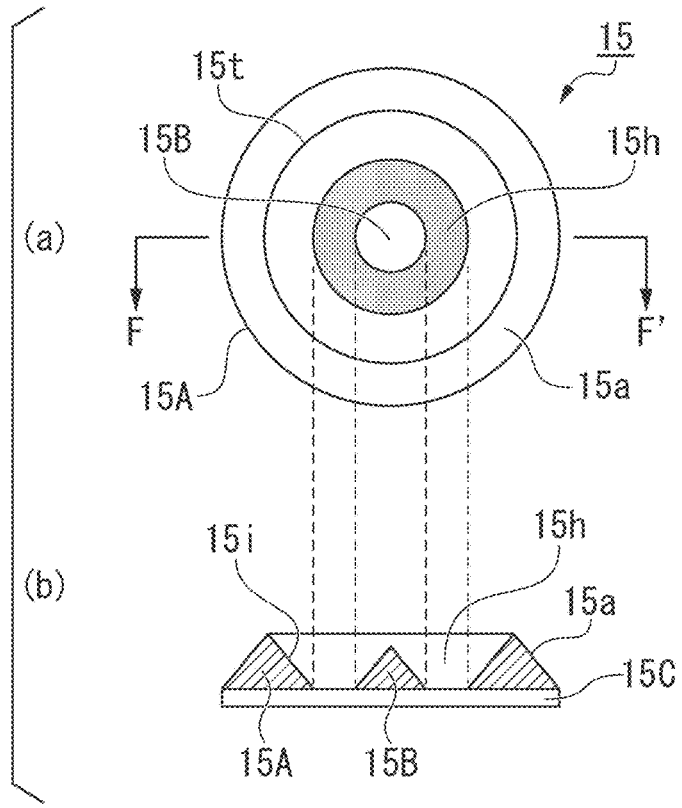
FIG. 6 shows diagrams of a preferable example of a shielding member of the present invention, (a) is a schematic plan view showing an example of a shielding member of a second embodiment, and (b) is a schematic cross-sectional view taken along the line F-F'.

In FIG. 6, (a) is a schematic plan view of a shielding member which is a preferable example of the second embodiment of the present invention and (b) is a schematic cross-sectional view thereof taken along the line F-F'. In (b) of FIG. 6, when the shielding member is provided in a single crystal growth device, a direction toward a substrate support part side of the shielding member is indicated as upward (upper side), and a direction toward a source storage part of the single crystal growth device is indicated as downward (lower side).

A shielding member 15 shown in FIG. 6 includes a torus structure 15A constituting the shielding member 14 as shown in FIG. 5, a conical structure 15B disposed in a hollow part 15*h* as shown in FIG. 1, and a table 15C on which the structure 15A and the structure 15B are placed. The table 15C may have any shape as long as it connects 15A and 15B, and may have a disk shape, a donut shape, a plate shape, or a rod shape. The thickness of the table can be arbitrarily selected, and is preferably uniform, but the present invention is not limited thereto. A vertical cross section of the torus (annular) structure 15A is a triangle as shown in (b) of FIG. 6, and has an inner inclined surface 15*i* on the side of the hollow part 15*h* and an outer inclined surface 15*a* toward the outside of the annular structure. In addition, a ridge (top part) 15*t* connecting vertices of a triangle may be a curved surface. The torus structure 15A may be solid or hollow, but the hollow structure has a stronger effect of blocking heat of the source storage part. The number of structures such as the structure 15B disposed inside the structure 15A, the shape, and position thereof can be arbitrarily selected as necessary.

Figure 7:
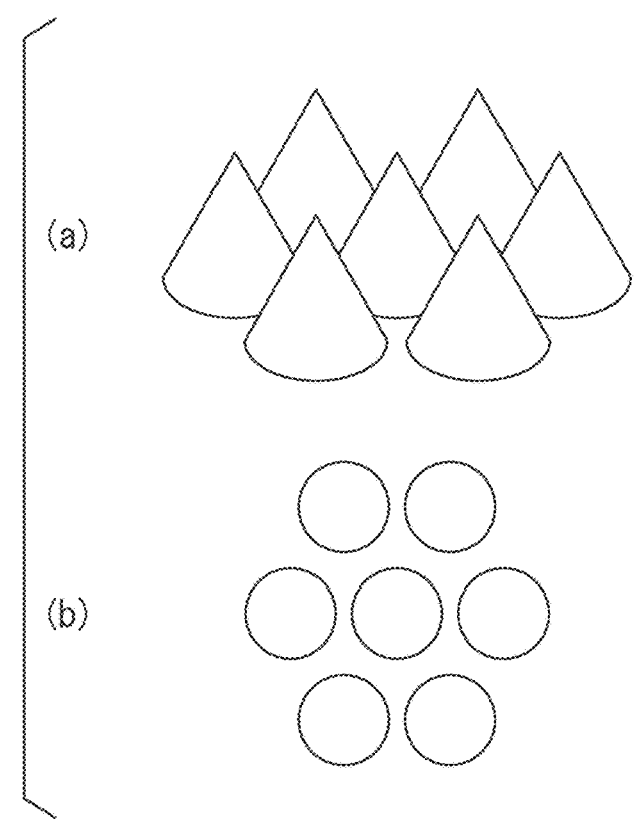
FIG. 7 shows diagrams of a preferable example of a shielding member of the present invention, (a) is a schematic plan view showing another example of the shielding member of the second embodiment, and (b) is a schematic cross-sectional view taken along the line F-F'.

In FIG. 7, (a) is a perspective view of a shielding member of another example and (b) is a schematic plan view thereof.

The shielding member shown in FIG. 7 has a configuration including a plurality of conical structures. The shielding member may include a table on which a plurality of conical structures are placed (corresponding to the reference numeral 15C in FIG. 6).

The example shown in FIG. 7 includes seven conical structures with the same size and the same shape. In this configuration, one conical structure is disposed at the center, and six conical structures are symmetrically disposed therearound. A configuration in which some or all of the conical structures have different sizes or shapes can be used.

Figure 8:
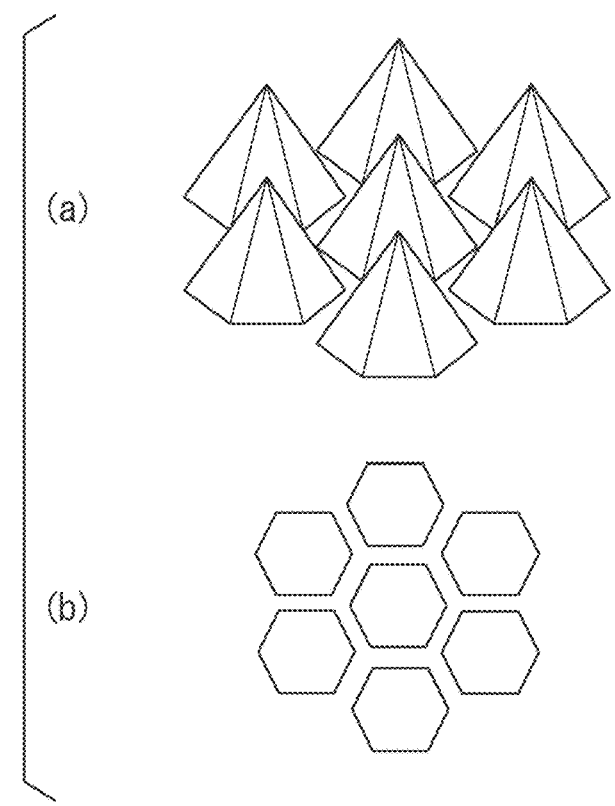
FIG. 8 shows diagrams of a preferable example of a shielding member of the present invention, (a) is a schematic plan view showing still another example of the shielding member of the second embodiment, and (b) is a schematic cross-sectional view taken along the line F-F'.

In FIG. 8, (a) is a perspective view of a shielding member of another example and (b) is a schematic plan view thereof.

The shielding member shown in FIG. 8 has a configuration including a plurality of hexagonal pyramidal structures. The shielding member may include a table on which a plurality of conical structures are placed (corresponding to the reference numeral 15C in FIG. 6).

The example shown in FIG. 8 includes seven hexagonal pyramidal structures with the same size and the same shape. In this configuration, one hexagonal pyramidal structure is disposed at the center, and six hexagonal pyramidal structures are symmetrically disposed therearound. A configuration in which some or all of the hexagonal pyramidal structures have different sizes or shapes can be used.

Figure 9:
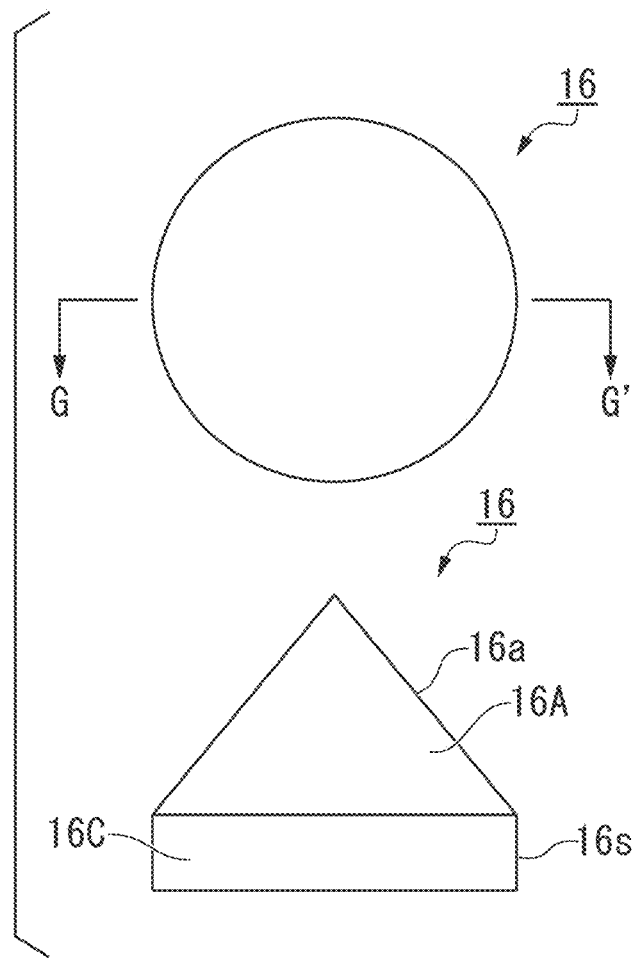
FIG. 9 shows diagrams of a preferable example of a shielding member of the present invention, (a) is a schematic plan view of a shielding member having a configuration in which a conical member is disposed on a column-shaped member as another embodiment of the present invention, and (b) is a schematic cross-sectional view taken along the line G-G'.

The shielding member of the present invention may have a configuration in which a non-flat plate like structure having an inclined surface on the substrate support part side when disposed is disposed on a flat plate like structure (for example, a conventionally used flat plate type structure). FIG. 9 shows an example thereof.

A shielding member 16 shown in FIG. 9 includes a cylindrical member (columnar member) 16C. The cylindrical member 16C is disposed on the side of the source storage part of the shielding member so that a side surface 16*s* is parallel (a direction perpendicular to the bottom surface) to a direction toward the substrate support part from the source storage part. In addition, an inclined surface 16*a* of a conical structure 16A and the side surface 16*s* of the cylindrical member 16C may be smoothly continuous. The cylindrical member 16C may be a plate similar to a conventional flat plate like shielding plate. The structure 16A and the member 16C may be connected or integrally formed.

A material which has sufficient durability for practical use in an environment in which a single crystal growth reaction of silicon carbide occurs can be used for the shielding member. For example, a carbon material and a metal carbide, for example, tantalum carbide (TaC), tungsten carbide (WC), niobium carbide (NbC), molybdenum carbide (MoC) or the like can be used. These materials can be suitably used because they have sufficient heat resistance to withstand temperatures of 2,000° C. or higher at which a single crystal growth reaction of silicon carbide is performed.

The inclined surface of the shielding member may be coated. In addition, a liner member may be attached to the inclined surface of the shielding member. For example, a metal carbide can be used as a material of the coating or the liner member. A metal carbide can be suitably used because it is stable in an environment in which single crystal growth occurs. Tantalum carbide and the like can be suitably used as a metal carbide contained in the coating or the liner member. Tantalum carbide (TaC) is considered to have a high melting point and chemical stability among transition metal carbides, and the development of a technology for forming a film on a graphite substrate is advanced (for example, refer to Japanese Patent No. 4498477)). Therefore, tantalum carbide can be more preferably used.

In the present invention, the surface roughness $R_a$ of the inclined surface of the shielding member is preferably less than 8 μm. In addition, the surface roughness $R_a$ here is based on JIS B0601: 2001 in contact type measurement. Since a flow of a gas containing a source can smoothly flow on the inclined surface, it is possible to prevent the deposit from being generated.

(Single Crystal Growth Device)

Figure 10:
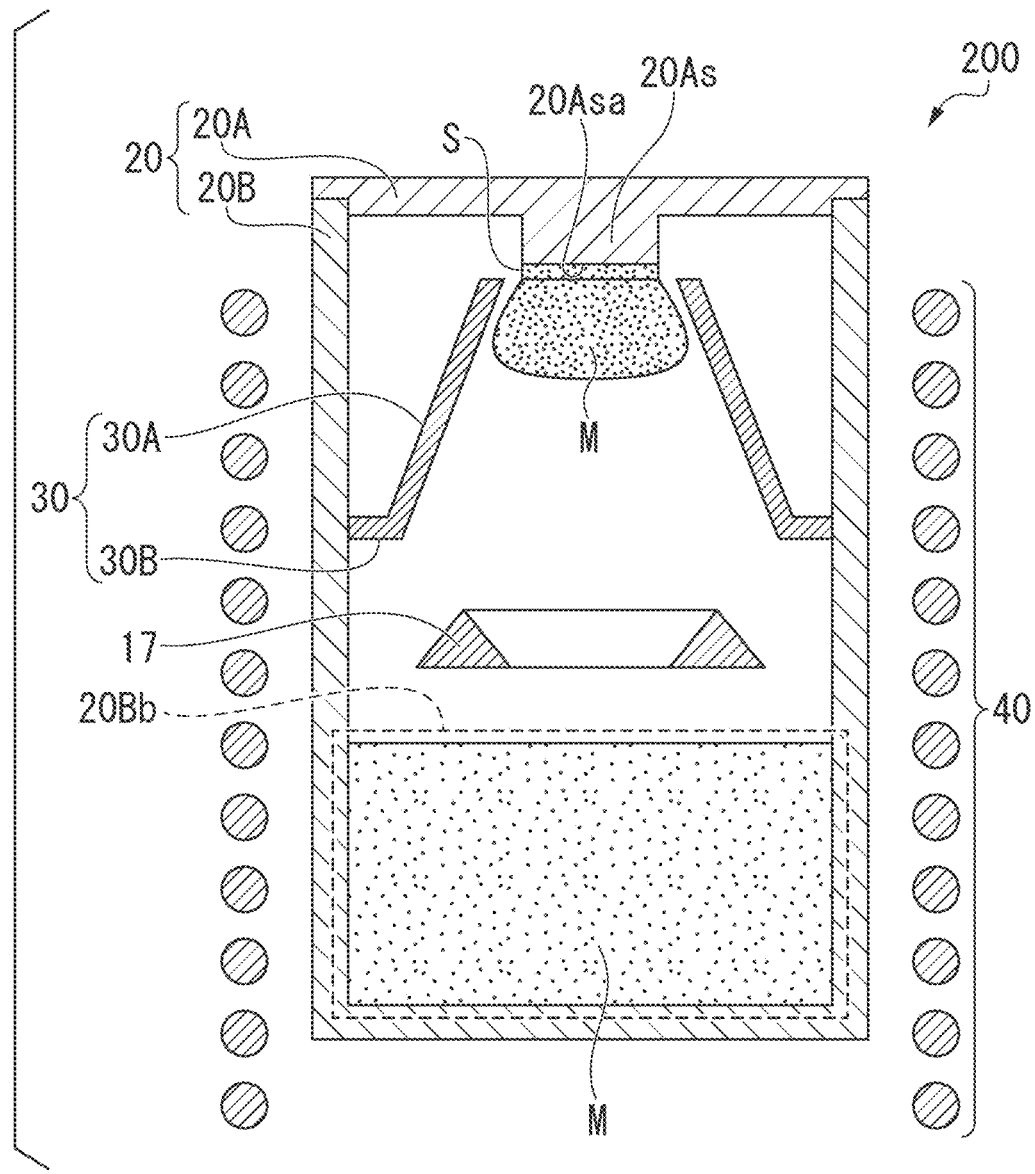
FIG. 10 is a schematic cross-sectional view showing an example of a single crystal growth device according to the present invention.

An example of a single crystal growth device 200 including the shielding member according to the present invention will be described with reference to FIG. 10.

The single crystal growth device 200 includes a crystal growth container 20 (including a container main body 20B and a container lid 20A), a guide member 30, and a shielding member 17. The shielding member 17 may be the same as the shielding member shown in FIG. 5. A heating unit 40, and an insulation material (not shown) for keeping the heated crystal growth container 20 warm are provided on the outer circumference of the container main body 20B. In FIG. 10, in order to help with understanding, a source (source material) for silicon carbide single crystal growth M, a silicon carbide seed crystal (seed crystal) S, and a silicon carbide single crystal W (single crystal) grown from a seed crystal S are shown together.

The source for silicon carbide single crystal growth M is stored in a lower part (a source storage part 20Bb) of the container main body 20B. The seed crystal S is provided on a substrate support part (pedestal) 20As provided in the container lid body 20B. The shielding member 17 is provided to be positioned between the source storage part 20Bb and the substrate support part 20As.

In the following drawings, a direction in which the pedestal 20As faces the source for silicon carbide single crystal growth M will be defined as a vertical direction, and a direction orthogonal to the vertical direction will be defined as a horizontal direction.

The shielding member 17 has an inclined surface. Therefore, the fluidity due to the inclined surface close to being parallel to a gas flow is improved, and crystal nuclei generated on the inclined surface fall due to gravity. As a result, growing of crystal nuclei is prevented, and it is possible to prevent deposits from being adhered to the shielding plate shape without changing a temperature environment.

A known crystal growth container 20 can be used as long as it is a crystal growth container for producing a silicon carbide single crystal using a sublimation method. The crystal growth container 20 has a high temperature during growth. Therefore, a material that can withstand high temperatures needs to be used for formation. For example, graphite has a very high sublimation temperature of 3,550° C., and can withstand high temperatures during growth.

The pedestal 20As that protrudes downward is provided at the inner central part of the container lid 20A. The silicon carbide seed crystal S is connected to one surface (seed crystal side surface) 20Asa of the pedestal 20As. The pedestal 20As faces the source for silicon carbide single crystal growth M stored in the crystal growth container 20 when the container lid 20A covers the container main body 20B. The source for silicon carbide single crystal growth M faces the seed crystal S placed on the pedestal 20As, and thereby a source gas can be efficiently supplied to the seed crystal S. The container lid 20A and the pedestal 20As may be formed as an integral member or may be separate members.

The pedestal 20As is preferably provided at the center of the container lid 20A in the horizontal direction. When the pedestal 20As is provided at the center of the container lid 20A in the horizontal direction, a growth rate of the silicon carbide single crystal W can be made constant in the horizontal direction.

The container lid 20A and the pedestal 20As are not particularly limited as long as they can withstand high temperatures, and the same material as the crystal growth container 20 can be used.

The guide member 30 controls a flow of a source gas (Si, SiC$_2$, Si$_2$C, etc.) between the container main body 20B and the container lid 20A for crystal growth.

The guide member 30 preferably has a tubular part 30A and a support part 30B. The tubular part 30A extends from the vicinity of the pedestal 20As toward a side wall of the container main body 20B.

The diameter of the container lid 20A is larger than the diameter of the pedestal 20As. Therefore, the tubular part 30A is preferably formed to expand from the vicinity of the pedestal 20As toward a side wall of the container main body 20B. The tubular part 30A is preferably formed over the entire circumference of the pedestal 20As. For example, the tubular part 30A may have a donut shape in a plan view.

When the tubular part 30A is provided over the entire circumference, the diameter of the silicon carbide single crystal W crystal-grown from the seed crystal S placed on the pedestal 20As can increase in any circumferential direction. When the tubular part 30A is inclined (extended), an angle of inclination is preferably the same when the tubular part 30A is cut at any surface perpendicular to the pedestal 20As. If an angle of inclination is the same, a diameter increment ratio of the silicon carbide single crystal W can be made constant.

The configuration of the support part 30B is not particularly limited as long as the tubular part 30A can be supported between the container main body 20B and the container lid 20A. A rod-like member or a plate-like member may be used, and a cylindrical member connected to the entire surface of the end of the tubular part 30A may be used.

A source gas (Si, SiC$_2$, Si$_2$C, etc.) generated from the source for silicon carbide single crystal growth M is supplied to the silicon carbide single crystal W on the lower temperature side.

Regarding the material of the guide member 30, a material that is stable at a high temperature and generates less impurity gas is preferable. Graphite, or graphite coated with tantalum carbide (TaC) is preferably used.

Regarding the heating unit 40 and the insulation material, those generally known can be used. As the heating unit 40, for example, a high-frequency coil can be used.

EXAMPLES

Example 1 and Comparative Example 1

(Simulation)
First, using a simulation of a temperature distribution in a crystal growth container of a single crystal growth device, a temperature environment in a crystal growth container including a shielding member having an inclined surface of the present invention and a temperature environment in a crystal growth container including a conventional flat plate like shielding plate were compared.

For simulation, temperature distribution analysis software "Virtual Reactor" (commercially available from STR-Group Ltd) was used.

A model for simulation having a container (crucible) made of graphite, an inner diameter of 230 mm, a seed crystal made of SiC, and a diameter of 6 inches was used. In addition, regarding a model of the shielding member of the present invention disposed in the container, a cone shape model made of graphite, and having an inclination of 23°, and a bottom surface of which a diameter is 4 mm larger than the seed crystal (Example 1) was used. Regarding a model of a conventional flat plate like shielding plate, a model having a diameter the same size as the bottom surface of Example 1 and a thickness of 15 mm (Comparative Example 1) was used. In a temperature range of 2,200° C. or higher used in SiC crystal growth in a sublimation method, a maximum temperature of the crucible was fixed, and differences in temperatures in respective places in both crucibles were compared, and represented as a relative difference.

The simulation results are shown in the following Table 1.

TABLE 1

| | Temperature of Example 1 − Temperature of Comparative Example 1 |
|---|---|
| Central part of seed crystal | 0.3° C. |
| Outer circumferential part of seed crystal | 0.3° C. |
| Central part of shielding member | −1.9° C. |
| Maximum temperature of source (raw material) | 0.1° C. |
| Minimum temperature of source | −0.4° C. |

As can be clearly understood from Table 1, it was found that the temperature environment in the crystal growth container including a shielding member having an inclined surface of the present invention was almost the same as the temperature environment in the crystal growth container including a conventional flat shielding plate.

Here, the container, the seed crystal, and the shielding member were actually used for producing a single crystal to be described below. However, when the single crystal was produced, the shielding member was coated with TaC.
(Production of Single Crystal)
Next, using respective crucibles of Example 1 and Comparative Example 1 described above, crystal growth was actually performed for 45 hours. Two types of the shielding member of Example 1 were prepared. Production was performed under two different conditions: a shielding member in which a base material was formed of graphite, a part of the inclined surface was coated with TaC, and graphite was exposed in the remaining part was used (Example 1-a), and a shielding member in which the entire inclined surface of the base material was completely coated with TaC coating was used (Example 1-b). As a result, in Comparative Example 1, deposits were adhered to the upper surface of the shielding member, and regarding an amount of the deposits, 29 g of deposits was generated. In the flat shape structure of Comparative Example 1, even if any of liner material installation, CVD treatment, and CVR treatment was performed on the surface of the shielding member, there was no significant difference in the amount of deposits generated. On the other hand, in Example 1-b in which the shielding member of which an upper surface had an inclined structure and was completely coated with TaC was used, no deposits were adhered at all. In addition, in Example 1-a in which the shielding member in which an upper surface had an inclined structure, and a part coated with TaC and a graphite part were on the inclined surface was used, there was no adhesion of deposits to the upper surface of the shielding member in the part coated with TaC or the graphite part. However, on the surface of the source, there was 20 g of a polycrystalline falling object which was inferred to have fallen after being formed on the shielding plate. Here, in Example 1-b, there was no polycrystalline falling object on the surface of the source. Accordingly, it was understood that, when the upper surface of the shielding member was made of graphite, if the upper surface was set to have an inclined structure, an effect of deposits falling and the deposits being prevented from being adhered to the upper surface of the shielding member was provided. In addition, it was found that, in order to prevent deposits from growing, it was more preferable for the entire upper surface (inclined surface) to be made of TaC.

Figure 11:
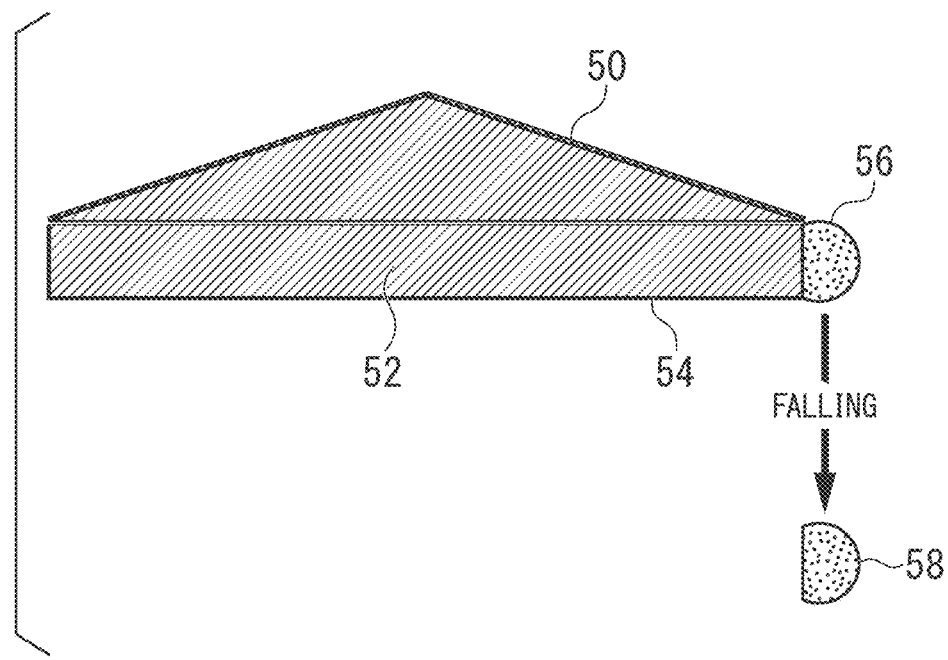
FIG. 11 is a schematic cross-sectional view conceptually explaining a polycrystalline falling object generation mechanism related to Example 1-a.

Speculations on the generation mechanism of the polycrystalline falling object in Example 1-a will be described with reference to FIG. 11. Although the shielding member of Example 1-a was conical, in order to facilitate the description, a shielding member in which a conical member was disposed on the column-shaped member, and only a slope was coated with TaC will be used for description. First, it was speculated that, due to the shape of the polycrystalline falling object observed in Comparative Example 1, deposits are accumulated on the graphite exposed part on the side surface of the shielding member and grown to some extent and thus dropped, or deposits are dropped during cooling because separation occurred due to a difference in thermal expansion between graphite and SiC (main composition of polycrystalline). Therefore, preferably all surfaces of the shielding member, or surfaces except at least the lower bottom surface, for example, all side surfaces of the shielding member, were preferably coated with TaC.

Example 2

In Example 2, a shielding member to be described below was used, and a SiC single crystal ingot was produced under the same conditions as in Example 1 except that a crucible with an inner diameter of 215 mm was used, and a growth time was longer than that in Example 1. The shielding member of Example 2 had a torus shape as shown in FIG. 5 and had a solid annular shape in a plan view, and a shielding member made of graphite (the outer diameter of a vertical cross section of an annular ring was 4 mm larger than that of a 6-inch seed crystal, and an inner diameter of 76 mm, a height of 50 mm) having a configuration with an inclined surface on the substrate support part side was used. In addition, the surface was coated such that tantalum carbide (TaC) powder was coated according to the following method. The TaC powder was prepared by grinding TaC (for example, using the method described in Japanese Unexamined Patent Application, First Publication No. H11-116399) obtained by reacting a Ta plate and graphite at a high temperature under an inert gas. The obtained TaC powder was mixed with a carbon adhesive containing a thermosetting resin and applied to the upper surface (inclined surface) of the shielding member. In addition, covering was performed by sprinkling TaC powder from above, and carbon derived from the adhesive was not visible on the outermost surface. Heating was performed at 250° C., the adhesive was cured, and TaC powder was fixed. Although a variation of Ra on TaC of the upper surface (inclined surface) of the produced shielding member was somewhat larger, a range was 8 μm to 27 μm.

Comparative Example 2

In Comparative Example 2, a SiC single crystal ingot was produced under the same conditions as in Example 2 except for the shielding member. The shielding member of Comparative Example 2 was a flat plate like shielding plate made of graphite, the thickness in the height direction was 50 mm, and the diameter was the same as the outer diameter of the annular ring of Example 2. In addition, the surface (upper surface) of the shielding member of Comparative Example 2 was coated with tantalum carbide (TaC) powder in the same manner as in Example 2.

In Table 2, amounts of deposits on the shielding members of Example 2 and the comparative example are shown as numerical values when the amount of deposits of Comparative Example 2 is set as 100. Each amount of deposits was calculated from a change in weight of the shielding member before and after growth. When the same TaC powder was fixed and coated, a torus shielding plate having an inclined surface had an amount of deposits adhered that was significantly smaller than that adhered to a flat plate.

TABLE 2

| | Amount of deposits |
|---|---|
| Comparative Example 2 | 100 |
| Example 2 | 0.02 |

Example 3

In Example 3, a shielding member to be described below was used, and a SiC single crystal ingot was produced under the same conditions as in Example 2 except that the growth time was longer than that in Example 2. Example 3 used a torus shape as shown in FIG. 5 which was the same as in Example 2, and was different from Example 2 in that, regarding a coating state of the surface, a liner material (a thickness of 0.2 mm) of tantalum carbide (TaC) was applied by adhesion to the surface of a graphite shielding member. A surface roughness Ra of the surface of the TaC liner material was 0.5 μm. After the SiC single crystal ingot was grown, there were no deposits at all.

Example 4

In Example 4, a SiC single crystal ingot was produced under the same conditions as in Example 2 except for a shielding member. Example 4 used a torus shape as shown in FIG. 5 which was the same as in Example 2, and was different from Example 2 in that, regarding a coating state of the surface of a graphite substrate, a TaC coating formed through CVD was provided. A surface roughness Ra of the surface of the TaC material was 3.1 µm. After the SiC single crystal ingot was grown, no deposits were adhered at all in Example 4 as in Example 3.

Example 5

In Example 5, a SiC single crystal ingot was produced under the same conditions as in Example 2 except for a shielding member. Example 5 used a torus shape as shown in FIG. 5 which was the same as in Example 2, and was different from Example 2 in that, regarding a coating state of the surface, a TaC coating formed through a chemical vapor reaction (CVR) was provided. A surface roughness Ra of the surface of the TaC material was 0.8 µm. After the SiC single crystal ingot was grown, no deposits were adhered at all in Example 5 as in Example 3.

Figure 12:
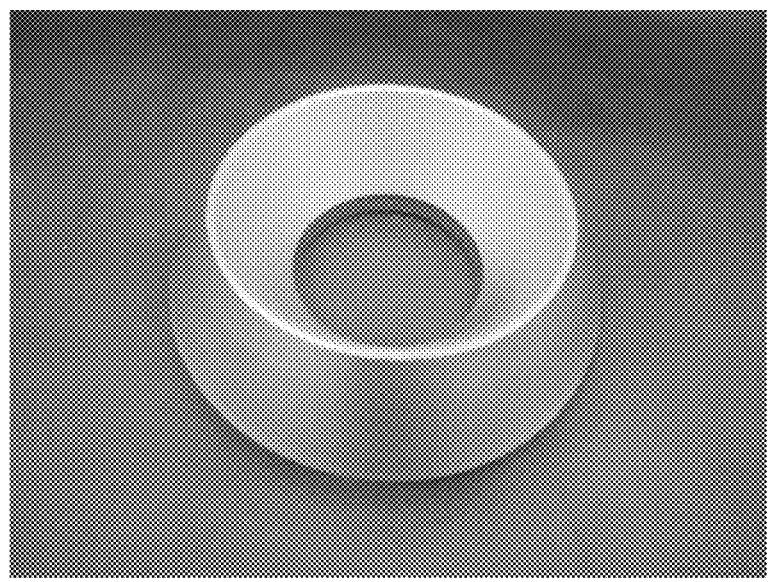
FIG. 12 is a photo image of a shielding member after a SiC single crystal ingot of Example 5 is produced.

FIG. 12 shows an image of a shielding member after a SiC single crystal ingot was produced. It was found that no deposits were adhered at all.

In the shielding member and the single crystal growth device having the same according to the present invention, even if a temperature in the vicinity of a seed crystal is lowered in order to increase a single crystal growth rate, it is possible to prevent production costs from increasing and single crystal quality from deteriorating.

REFERENCE SIGNS LIST 10, 11, 12, 13, 14, 15, 16, 17: Shielding member
10a, 11a, 12a, 13a, 14a, 15a, 16a: Inclined surface
10t, 11t, 12t, 13t, 14t, 15t: Top part
14t, 15t: Ridge
10b, 11b, 12b, 13b, 14b: Bottom part (bottom surface)
14h, 15h: Hollow part
14i, 15i: Inner inclined surface
16s: Side surface of cylindrical member
15A: Torus structure
15B: Conical structure
15C: Table
16A: Conical structure
16C: Cylindrical member
100, 200: Single crystal growth device
20, 101: Crystal growth container
20A Container lid
20As: Substrate support part
20Asa: One surface of pedestal
20B: Container main body
20Bb, 102: Source storage part
30: Guide member
30A: Tubular part
30B: Support part
40, 105: Heating unit
50: TaC film
52: Shielding member made of graphite
54: Graphite exposed part
56: Polycrystalline deposit
58: Polycrystalline falling object
103: Seed crystal
104: Substrate support part
106: Conventional shielding plate
107: Source part
M: Source for silicon carbide single crystal growth
S: Seed crystal
W: Silicon carbide single crystal

What is claimed is:
1. A shielding member, wherein
the shielding member is formed of at least one structure which has a non-flat plate shape having an inclined surface, and the inclined surface is located on a side of a substrate support part when the shielding member is disposed in a single crystal growth device,
wherein an inclination angle of the inclined surface is in a range of 20° to 75°,
wherein the single crystal growth device comprising:
a crystal growth container;
a source storage part that is positioned at a lower inner part of the crystal growth container;
the substrate support part, wherein the support part is disposed above the source storage part and supports a substrate to make the substrate face the source storage part; and
a heating device that is disposed on an outer circumference of the crystal growth container,
wherein the shielding member is disposed between the source storage part and the substrate support part, and
wherein a single crystal of a source is grown on the substrate by sublimating the source from the source storage part.

2. The shielding member according to claim 1, wherein the non-flat plate shape is one shape selected from the group consisting of an approximately cone shape, an approximately truncated cone shape, an approximately pyramid shape, an approximately truncated pyramid shape, and a torus shape.

3. The shielding member according to claim 2, wherein a top part of the non-flat plate shape is formed as a curved surface.

4. The shielding member according to claim 1, having a plurality of the structure which has a non-flat plate shape having an inclined surface.

5. The shielding member according to claim 1, wherein the inclined surface is coated with a metal carbide, or a liner member made of a metal carbide is attached to the inclined surface.

6. The shielding member according to claim 5, wherein the metal carbide is TaC.

7. The shielding member according to claim 1, wherein a surface roughness Ra of the inclined surface is less than 8 µm.

8. A single crystal growth device comprising:
a crystal growth container;
a source storage part that is positioned at a lower inner part of the crystal growth container;
a substrate support part, wherein the support part is disposed above the source storage part and supports a substrate to make the substrate face the source storage part;
a shielding member formed of at least one structure which has a non-flat plate shape having an inclined surface, wherein the inclined surface is located on a side of the substrate support part when the shielding member is disposed in the single crystal growth device and an inclination angle of the inclined surface is in a range of 20° to 75°, and
a heating device that is disposed on an outer circumference of the crystal growth container,
wherein the shielding member is disposed between the source storage part and the substrate support part, and wherein a single crystal of a source is grown on the substrate by sublimating the source from the source storage part.

9. The single crystal growth device according to claim 8, wherein the non-flat plate shape is one shape selected from the group consisting of an approximately cone shape, an approximately truncated cone shape, an approximately pyramid shape, an approximately truncated pyramid shape, and a torus shape.

10. The single crystal growth device according to claim 9, wherein a top part of the non-flat plate shape is formed as a curved surface.

11. The single crystal growth device according to claim 8, having a plurality of the structure which has a non-flat plate shape having an inclined surface.

12. The single crystal growth device according to claim 8, wherein the inclined surface is coated with a metal carbide or a liner member made of a metal carbide is attached to the inclined surface.

13. The single crystal growth device according to claim 12, wherein the metal carbide is TaC.

14. The single crystal growth device according to claim 8, wherein a surface roughness Ra of the inclined surface is less than 8 μm.

15. The shielding member according to claim 1, wherein the non-flat plate shape is a hollow torus shape.

16. The shielding member according to claim 1, wherein the non-flat plate shape consists of:
    a first structure having a hollow torus shape in which a hollow part is provided in the center of the torus shape,
    a second structure having a conical shape, and
    a table on which the first structure and the second structure are placed,
    wherein the second structure is disposed in the hollow part of the first structure.

17. The shielding member according to claim 1, wherein the inclination angle is an angle formed by a bottom surface of the shielding member and the inclined surface in a vertical cross section of the shielding member.

18. The single crystal growth device according to claim 8, wherein the non-flat plate shape is a hollow torus shape.

19. The single crystal growth device according to claim 8, wherein the non-flat plate shape consists of:
    a first structure having a hollow torus shape in which a hollow part is provided in the center of the torus shape,
    a second structure having conical shape, and
    a table on which the first structure and the second structure are placed,
    wherein the second structure is disposed in the hollow part of the first structure.

* * * * *